Sept. 22, 1970 G. R. ANTELL 3,530,015

METHOD OF PRODUCING GALLIUM ARSENIDE DEVICES

Filed Jan. 12, 1968 2 Sheets-Sheet 1

Inventor
GEORGE R. ANTELL
By Isidore Togut
Attorney

METHOD OF PRODUCING GALLIUM ARSENIDE DEVICES

Filed Jan. 12, 1968 2 Sheets-Sheet 2

Inventor
GEORGE R. ANTELL
By [signature]
Attorney

United States Patent Office 3,530,015
Patented Sept. 22, 1970

3,530,015

METHOD OF PRODUCING GALLIUM ARSENIDE DEVICES

George Richard Antell, Saffron Walden, England, assignor to International Standard Electric Corporation, New York, N.Y., a corporation of Delaware Filed Jan. 12, 1968, Ser. No. 697,480
Claims priority, application Great Britain, Jan. 13, 1967, 1,852/67
Int. Cl. H01l 7/44
U.S. Cl. 148—188 8 Claims

ABSTRACT OF THE DISCLOSURE

This is a method of diffusing impurities into gallium arsenide devices without surface erosion and oxygen contamination by depositing an impurity doped layer of silicon onto a surface of gallium arsenide and diffusing the impurities into the gallium arsenide by heating the device in a sealed evacuated arsenic free atmosphere. Silicon will not diffuse in an arsenic free atmosphere and acts as a barrier to oxygen attempting to enter the PN junction. After the diffusion is complete, the silicon layer is removed.

BACKGROUND OF THE INVENTION

Figure 1A:
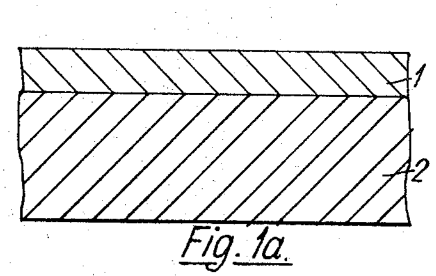
Figure 1B:
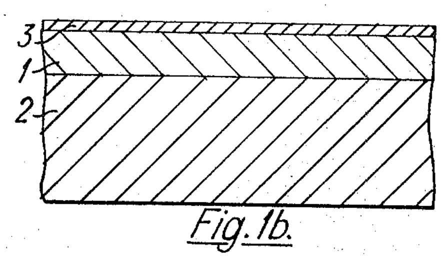

This invention relates to a method for producing gallium arsenide devices.

Diffusion into unprotected gallium arsenide surfaces can cause erosion. This erosion is particularly troublesome in epitaxial material and also under conditions when synthetic quartz with its high water content must be used to avoid thermal conversion.

Another problem with diffusion in gallium arsenide is that oxygen interferes with shallow slow moving junctions, i.e. in which the surface concentration is about $10^{19}$ cm.$^{-3}$ or less as opposed to fast diffusions into unprotected surfaces where surface concentrations are much higher.

Oxygen free diffusions are required for transistors, varactors and avalanche diodes.

It is an object of the present invention to avoid surface erosion problems and prevent diffusion of oxygen into the gallium arsenide slice.

SUMMARY OF THE INVENTION

According to the invention there is provided a method of producing a gallium arsenide semiconductor device which includes the steps of depositing on a surface of a region of semiconducting gallium arsenide a silicon layer doped with an acceptor impurity or with a donor impurity other than silicon, and heating in an arsenic free atmosphere to diffuse the impurity into the surface. The improvements over the prior art results from the silicon layer preventing surface erosion and oxygen contamination of the gallium arsenide device while diffusion of impurities is taking place.

IN THE DRAWINGS

FIGS. 1*a* to 1*d* show successive stages in the production of a gallium arsenide mesa diode.

FIGS. 2*a* to 2*d* show successive stages in the production of a gallium arsenide planar diode, and FIGS. 3*a* to 3*f* show successive stages in the production of a gallium arsenide transistor.

DETAILED DESCRIPTION

Referring to FIG. 1*a*, a layer 1 of N-type gallium arsenide is deposited epitaxially on a substrate 2 of N+ gallium arsenide. The layer 1 is doped in the region of $10^{16}$ cm.$^{-3}$ and is about 20 microns thick.

After suitable cleaning, a layer 3 (FIG. 1*b*) of zinc or magnesium doped silicon, about 3,000 A. thick, is deposited on the surface of the layer 1. The doped silicon layer 3 is deposited by sputtering in an inert atmosphere using a silicon electrode on which is placed the requisite amount of zinc or magnesium. Alternatively, the doped silicon layer is deposited by subjecting to a radio frequency electric discharge a low pressure atmosphere of silicon hydride gas and zinc or magnesium vapor from an evaporator.

Figure 1C:
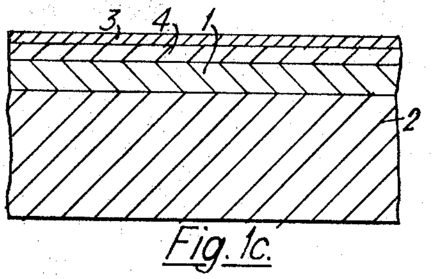

The slice is then sealed in an evacuated arsenic free synthetic quartz capsule, and heated to cause the zinc or magnesium to diffuse into the surface of the slice to form a P-type region 4 (FIG. 1*c*). Silicon does not diffuse in an arsenic free atmosphere. At 900° C. the P-type region 4 has a depth of 5 to 6 microns after 5 hours. The silicon acts as a barrier to oxygen entering the P-N junction.

After the diffusion, the doped silicon layer 3 is removed, for example by concentrated hydrofluoric acid. Suitable ohmic contacts are provided to both major surfaces of the diffused slice, one to the P-type region and one to the N+ substrate.

Figure 1D:
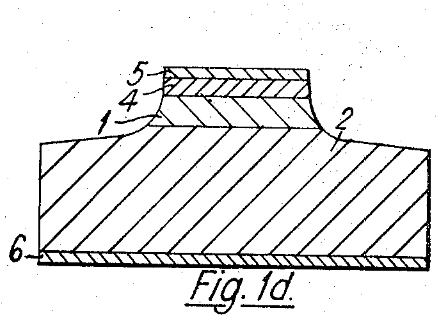

Individual mesa diodes are cut from the slice using suitable means, and such a diode is shown in FIG. 1*d*, complete with contact 5 to the P-type region 4 and contact 6 to the N+ substrate 2. The diodes are suitable for varactors or avalanche oscillators.

To produce a planar diode, one again starts with an epitaxial layer 11 (FIG. 2*a*) of N-type conductivity gallium arsenide on a substrate 12 of N+ gallium arsenide. A silica layer 13 (FIG. 2*b*) is deposited over the whole of the major surface of the N-type layer 11 and spaced windows are provided in the silica layer to define the surface area of the required P-type regions.

Figure 2A:
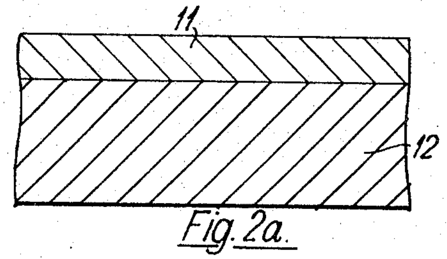
Figure 2B:
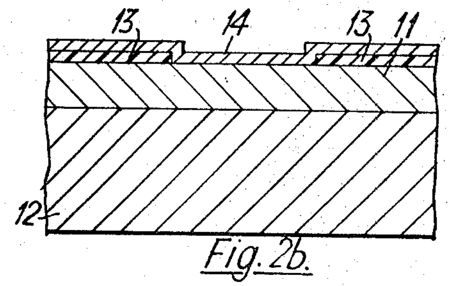
Figure 2C:
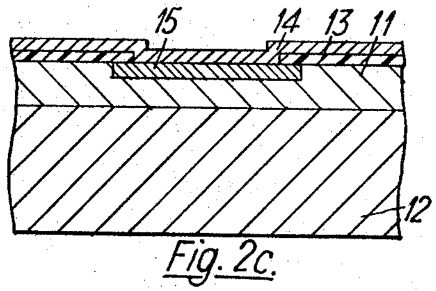
Figure 2D:
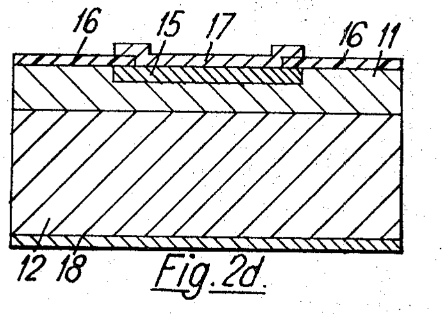

A layer 14 of zinc or magnesium doped silicon is then deposited over the major surface of the slice, and diffusion carried out in an arsenic free atmosphere as already described to cause the zinc or magnesium to diffuse into the surface of the slice at the windows to form P-type regions such as region 15 (FIG. 2*c*). The silicon acts as a barrier to oxygen entering the P-N junction.

The silicon and silica layers are removed, and a new silica layer 16 (FIG. 2*d*) is deposited onto the slice, and spaced windows are provided in the silica layer 16 to define the surface area of ohmic contacts to the individual P-type regions 15.

Suitable ohmic contacts such as 17 are provided to the P-type regions and contacts 18 to the N+ substrate 12, and individual diodes cut from the slice.

To produce an oxygen free transistor structure, one again starts with an epitaxial layer 31 (FIG. 3*a*) of N-type gallium arsenide on a substrate 32 of N+ gallium arsenide. A silica layer 33 (FIG. 3*b*) is deposited over the whole of the major surface of the N-type layer 31 and spaced windows provided in the silica layer to define the surface area of the transistor base.

Figure 3A:
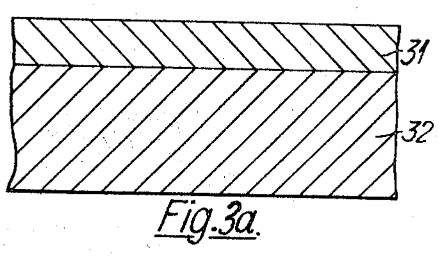
Figure 3B:
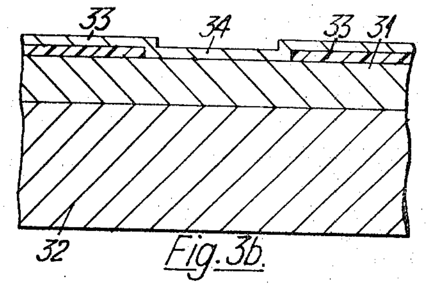
Figure 3C:
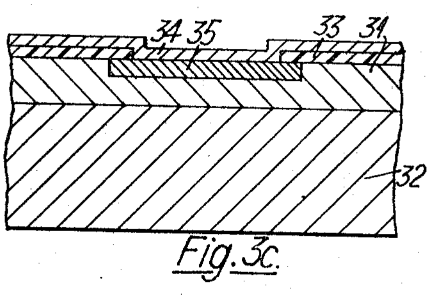
Figure 3D:
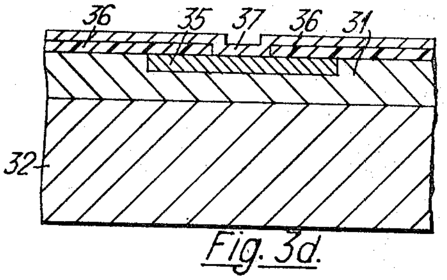

A layer 34 of zinc or magnesium doped silicon is then deposited over the major surface of the slice, and diffusion carried out in an arsenic free atmosphere as already described to cause the zinc or magnesium to diffuse into the surface of the slice at the windows to form P-type base regions such as 35 (FIG. 3*c*). The silicon acts as a barrier to oxygen entering the P-N junction.

The silicon and silica layers are removed, and a new silica layer 36 (FIG. 3*d*) is deposited onto the slice, and spaced windows are provided in the silica layer to define the surface area of the transistor emitter. A pure silicon layer 37 is deposited over the whole of the major surface of the slice.

Figure 3E:
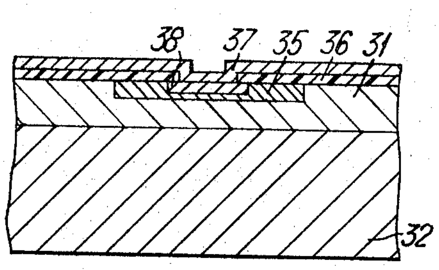

Silicon from the layer 37 is now diffused in through the emitter window under an arsenic pressure of about ⅓ atmosphere, resulting in the formation of N-type emitter regions such as 38 (FIG. 3*e*).

The diffusion is carried out by sealing the slice in an evacuated quartz capsule together with a weighed amount of deoxidised arsenic, and heating. Diffusion only takes place where the silicon is in contact with the gallium arsenide surface. The remainder of the silicon layer does not diffuse due to the masking action of the silica layer.

The silicon layer in contact with the gallium arsenide recrystallises during the emitter diffusion and becomes conducting. Since arsenic is present, and arsenic is a donor impurity for silicon (but ineffective as a donor for gallium arsenide) the recrystallized silicon is of $N^+$ type and therefore suitable as the ohmic contact to the emitter.

Instead of a pure silicon layer, a silicon donor impurity such as arsenic, phosphorus or antimony may be included with the silicon layer, the donor being diffused under arsenic pressure as described above. This inclusion of the donor with the silicon film aids the recrystallisation of the silicon and the doping to $N^+$ type.

Since the transistor may have an emitter of no more than 0.001 inch across, it is useful to be able to produce such a small contact to the emitter during the emitter diffusion step.

Figure 3F:
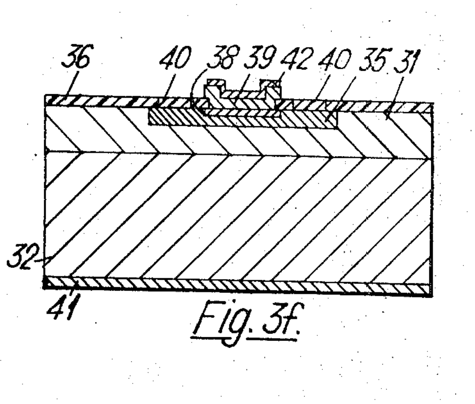

Finally, as shown in FIG. 3*f*, the silicon layer is removed except over the emitter, the remaining silicon forming the emitter contact 39, ohmic contacts 40 and 41 of suitable material are made respectively to the base region 35 and to the collector region 31 via the substrate 32, and a metal contact 42 applied to emitter contact 39.

In all the above described embodiments, other gallium arsenide acceptor impurities such as beryllium, cadmium or manganese may be used to dope the silicon layer instead of zinc and magnesium.

Gallium arsenide semiconductor devices such as diodes and transistors may be produced starting with P-type gallium arsenide, instead of N-type.

Although silicon itself is a donor impurity for gallium arsenide, where it is desired to use another gallium arsenide donor impurity, such as tin, the donor impurity is used to dope a deposited silicon layer on the P-type gallium arsenide, and diffusion carried out in an arsenic free atmosphere. Under these conditions, as already described, the silicon does not diffuse but the impurity will diffuse into the gallium arsenide. The silicon acts as a barrier to oxygen entering the P-N junction.

It is to be understood that the foregoing description of specific examples of this invention is made by way of example only and is not to be considered as a limitation on its scope.

I claim:

1. A method of producing a gallium arsenide semiconductor device comprising the steps of depositing on a surface of a region of semiconducting gallium arsenide a silicon layer doped with an impurity other than silicon, and heating in an arsenic free atmopshere to diffuse the impurity into the surface.

2. A method as claimed in claim 1 in which the gallium arsenide is of N-type conductivity and the silicon layer is doped with an acceptor impurity of zinc or magnesium.

3. A method as claimed in claim 1 in which the doped silicon layer is deposited by sputtering.

4. A method as claimed in claim 1, in which the gallium arsenide region is an epitaxially deposited layer.

5. A method of producing a gallium arsenide diode which includes the steps of diffusing a P-type conductivity region into a N-type conductivity region by the steps of depositing on a surface of a region of semiconducting gallium arsenide a silicon layer doped with an impurity other than silicon, and heating in an arsenic free atmosphere to diffuse the impurity into the surface and further comprising the steps of providing a silica layer having a window therein to define the surface area of the P-type region, removing the silicon and silica layers, depositing onto the surface of the P-type region a new layer of silica having a window therein to define the surface area of an ohmic contact to the P-type layer, and providing ohmic contacts for the P-type region and for the N-type region.

6. A method of producing a gallium arsenide transistor which includes the steps of diffusing a P-type conductivity base region into a N-type conductivity collector region by the steps of depositing on a surface of a region of semiconducting gallium arsenide a silicon layer doped with an impurity other than silicon, and heating in an arsenic free atmosphere to diffuse the impurity into the surface and further comprising the steps of providing a silica layer having a window therein to define the surface area of the base region, removing the silicon and silica layers, providing on the surface of both the P-type region and the N-type region a new layer of silica having a window therein to define the surface area of an emitter region, depositing a layer of silicon onto the new silica layer and in the window, heating under arsenic pressure to diffuse silicon from the silicon layer in the window into the surface to form the emitter region, removing the silicon layer at least from over the silica layer, and providing ohmic contacts for the emitter, base and collector regions respectively.

7. A method as claimed in claim 6 in which the emitter contact is formed by recrystallisation of the silicon layer continguous with the surface of the emitter region during the heating step to diffuse in silicon.

8. A method as claimed in claim 6 in which the silicon layer includes a silicon donor impurity.

References Cited

UNITED STATES PATENTS 3,406,049 10/1968 Marinace ---------- 148—187

L. DEWAYNE RUTLEDGE, Primary Examiner

R. A. LESTER, Assistant Examiner

U.S. Cl. X.R.

29—578; 148—174, 175, 187